United States Patent
Yamakawa et al.

(10) Patent No.: US 9,112,120 B2
(45) Date of Patent: Aug. 18, 2015

(54) WHITE LIGHT SOURCE AND WHITE LIGHT SOURCE SYSTEM INCLUDING THE SAME

(75) Inventors: Masahiko Yamakawa, Yokohama (JP); Yasuhiro Shirakawa, Yokohama (JP)

(73) Assignees: KABUSHIKI KAISHA TOSHIBA, Tokyo (JP); TOSHIBA MATERIALS CO., LTD., Yokohama-Shi, Kanagawa-Ken (JP)

( * ) Notice: Subject to any disclaimer, the term of this patent is extended or adjusted under 35 U.S.C. 154(b) by 0 days.

(21) Appl. No.: 13/983,378

(22) PCT Filed: Apr. 18, 2011

(86) PCT No.: PCT/JP2011/059484
§ 371 (c)(1),
(2), (4) Date: Aug. 2, 2013

(87) PCT Pub. No.: WO2012/108065
PCT Pub. Date: Aug. 16, 2012

(65) Prior Publication Data
US 2013/0307011 A1    Nov. 21, 2013

(30) Foreign Application Priority Data

Feb. 9, 2011    (JP) .................................. 2011-026098

(51) Int. Cl.
*H01L 33/50* (2010.01)
*F21K 99/00* (2010.01)
(Continued)

(52) U.S. Cl.
CPC ................ *H01L 33/50* (2013.01); *F21K 9/135* (2013.01); *F21K 9/56* (2013.01); *F21V 3/0472* (2013.01);
(Continued)

(58) Field of Classification Search
CPC ...... H01L 33/50; H01L 33/501; H01L 33/502
See application file for complete search history.

(56) References Cited

U.S. PATENT DOCUMENTS 7,564,180 B2    7/2009  Brandes
7,635,438 B2   12/2009  Tamatani et al.
(Continued)

FOREIGN PATENT DOCUMENTS

AU    2008321873       5/2009
CN    101099245 A1    1/2008
(Continued)

OTHER PUBLICATIONS

English Translation (mailed Aug. 22, 2013) of International Preliminary Report on Patentability for PCT/JP2011/059484, and Written Opinion of the International Searching Authority (originally mailed Jul. 19, 2011).
(Continued)

*Primary Examiner* — Amar Movva
(74) *Attorney, Agent, or Firm* — Harness, Dickey & Pierce, PLC

(57) ABSTRACT

The present invention provides a white light source satisfying a relational equation of $$-0.2 \leq [(P(\lambda) \times V(\lambda))/(P(\lambda max1) \times V(\lambda max1)) - (B(\lambda) \times V(\lambda))/(B(\lambda max2) \times V(\lambda max2))] \leq +0.2,$$

assuming that: a light emission spectrum of the white light source is $P(\lambda)$; a light emission spectrum of black-body radiation having a same color temperature as that of the white light source is $B(\lambda)$; a spectrum of a spectral luminous efficiency is $V(\lambda)$; a wavelength at which $P(\lambda) \times V(\lambda)$ becomes largest is $\lambda max1$; and a wavelength at which $B(\lambda) \times V(\lambda)$ becomes largest is $\lambda max2$. According to the above white light source, there can be provided a white light source capable of reproducing the same light emission spectrum as that of natural light.

13 Claims, 12 Drawing Sheets

(51) Int. Cl.
*F21V 3/04* (2006.01)
*H05B 33/10* (2006.01)
*H05B 33/14* (2006.01)
*F21Y 101/02* (2006.01)

(52) U.S. Cl.
CPC ............ *H01L 33/501* (2013.01); *H01L 33/502* (2013.01); *H05B 33/10* (2013.01); *H05B 33/14* (2013.01); *F21Y 2101/02* (2013.01)

(56) References Cited

U.S. PATENT DOCUMENTS

| | | | |
|---|---|---|---|
| 8,120,240 | B2 | 2/2012 | Brandes |
| 8,513,873 | B2 | 8/2013 | Brandes |
| 8,847,507 | B2 | 9/2014 | Kasakura et al. |
| 2006/0152140 | A1 | 7/2006 | Brandes |
| 2008/0017831 | A1 | 1/2008 | Tamatani |
| 2010/0063566 | A1 | 3/2010 | Uchiumi et al. |
| 2010/0070064 | A1 | 3/2010 | Tseng et al. |
| 2012/0032208 | A1 | 2/2012 | Brandes |
| 2013/0221866 | A1 | 8/2013 | Kasakura et al. |

FOREIGN PATENT DOCUMENTS

| | | |
|---|---|---|
| CN | 101108966 A2 | 1/2008 |
| CN | 101806430 A | 8/2010 |
| CN | 101855492 A3 | 10/2010 |
| EP | 2211083 | 7/2010 |
| JP | H10-242513 A | 9/1998 |
| JP | 2004-128443 A | 4/2004 |
| JP | 2007-288138 A | 11/2007 |
| JP | 2010067961 A4 | 3/2010 |
| WO | WO-2008/069101 A1 | 6/2008 |

OTHER PUBLICATIONS

Extended European Search Report dated Jun. 26, 2014 in related application.
International Search Report (in Japanese with English translation) for PCT/JP2011/059484, mailed Jul. 19, 2011; ISA/JP.

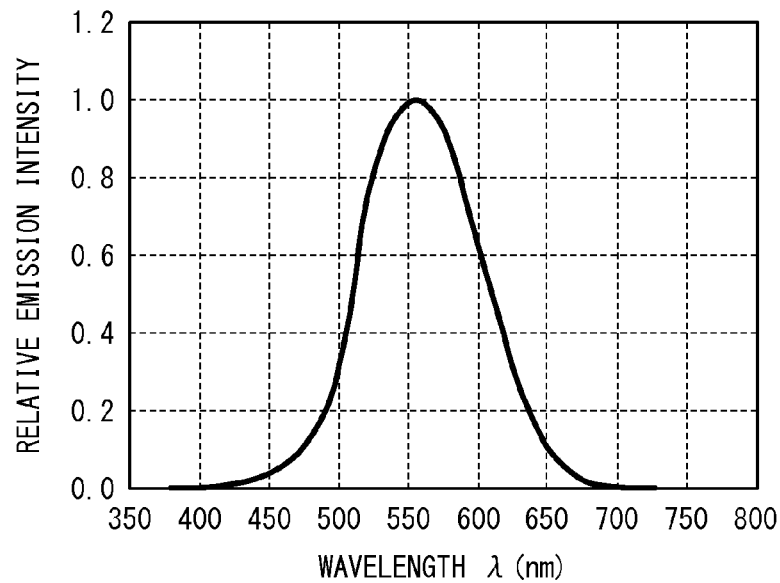
FIG. 1
$$B(\lambda) = \frac{2hc^2}{\lambda^5} \frac{1}{e^{hc/\lambda kT}-1}$$
FIG. 2
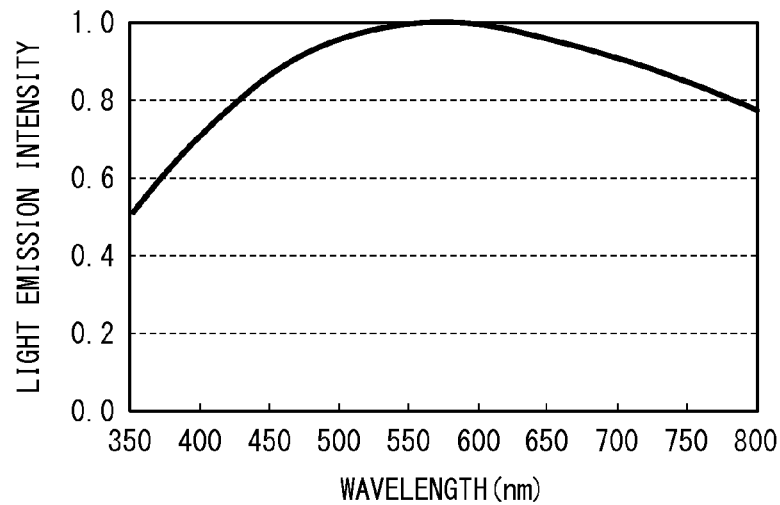
FIG. 3

WHITE LIGHT SOURCE AND WHITE LIGHT SOURCE SYSTEM INCLUDING THE SAME

CROSS-REFERENCE TO RELATED APPLICATIONS

This application is a 371 U.S. National Stage of International Application No. PCT/JP2011/059484, filed on Apr. 18, 2011, which claims priority to Japanese Patent Application No. 2011-026098, filed on Feb. 9, 2011. The contents of the above applications are incorporated herein by reference in their entirety.

TECHNICAL FIELD

The present invention relates to a white light source and a white light source system including the white light source. More particularly, the present invention relates to a white light source having a light emission spectrum close to the light emission spectrum of natural light, and relates to a white light source system including the white light source.

BACKGROUND ART

In recent years, white light sources including light emitting diodes (LEDs) have attracted attention in terms of energy saving measures and a reduction in the amount of emitted carbon dioxide. As compared with conventional incandescent bulbs including tungsten filaments, LEDs have longer service life, and enable energy saving. As disclosed in Japanese Patent Laid-Open (Unexamined Publication) No. 10-242513 (Patent Document 1), in conventional white LEDs, YAG phosphors are excited using blue LEDs each having a light emission peak wavelength in a range of 400 to 530 nm, and the blue light emitted from the LEDs and the yellow light emitted from the YAG phosphors are mixed with each other, whereby white light is achieved and realized.

White light sources including LEDs have been widely used as backlights of traffic signal lights and liquid crystal displays (LCD) as well as general lighting equipment (illuminating equipment) such as room lights. In the light emission spectra of conventional white light sources including blue LEDs, the peak height of the blue light emitted from the blue LEDs is as large as at least 1.5 times the peak height of the yellow light emitted from phosphors, and hence influences of the blue light tend to be strong.

Under the circumstances, with the popularization of the white light sources including LEDs, adverse effects of the white light sources on human bodies start to be worried about. As described above, the light emission peaks of blue LEDs are strong in conventional white LEDs. Such white light having a strong blue emission peak is significantly different from that of natural light. Here, the natural light refers to sunlight.

According to the pamphlet of International Publication No. WO 2008/069101 (Patent Document 2), which has been achieved in consideration of the influences of such white light sources on human bodies, LEDs and phosphors having different light emission peaks are combined, and four types of light emission peak are thus mixed, whereby a white light with a small deviation from the spectral luminous efficiency is provided.

Here, the sensitivity of a human eye to light is referred to as luminosity function, and the spectral luminous efficiency is defined as standard spectral luminosity function $V(\lambda)$ by International Commission on Illumination (CIE). Accordingly, the spectral luminous efficiency and the standard spectral luminosity function $V(\lambda)$ are the same in meaning. FIG. 1 shows the spectral luminous efficiency $V(\lambda)$ defined by CIE. That is, FIG. 1 shows that humans recognize light having a wavelength of about 555 nm at the highest sensitivity.

On the other hand, Patent Document 2 has an object to control light having a wavelength in a range of 420 to 490 nm, in consideration of influences of blue light on human bodies. Such a method can be expected to produce an effect of normalizing the secretion of melatonin that is one of hormones concerning adjustment by a biological clock in the nighttime.

In this regard, humans have a circadian rhythm (24-hour rhythm) controlled by an internal body clock. Humans are supposed to basically live under natural light, but there are a variety of lifestyles, such as long-time indoor work and a day-night reversal style, in modern society. If a life without exposure to natural light is continued for a long period, the circadian rhythm is disturbed, and adverse effects on human bodies are worried about.

PRIOR ART DOCUMENTS

Patent Document

Patent Document 1: Japanese Patent Laid-Open No. 10 (1998)-242513
Patent Document 2: the pamphlet of International Publication No. WO 2008/069101

DISCLOSURE OF THE INVENTION

Problems to be Solved by the Invention

Current white light sources including LEDs, that is, white light sources including blue LEDs have light emission spectra significantly different from that of natural light. A long-time life under irradiation by such white light sources may adversely affect a human circadian rhythm.

The present invention, which has been made in order to deal with such a problem, has an object to provide a white light source having a light emission spectrum close to the light emission spectrum of natural light.

Means for Solving the Problems

In order to achieve the above-mentioned object, a white light source according to the present invention satisfies a relational equation of $-0.2 \leq [(P(\lambda) \times V(\lambda))/(P(\lambda max1) \times V(\lambda max1)) - (B(\lambda) \times V(\lambda))/(B(\lambda max2) \times V(\lambda max2))] \leq 0.2$, assuming that: a light emission spectrum of the white light source is $P(\lambda)$; a light emission spectrum of black-body radiation having a same color temperature as that of the white light source is $B(\lambda)$; a spectrum of a spectral luminous efficiency is $V(\lambda)$; a wavelength at which $P(\lambda) \times V(\lambda)$ becomes largest is $\lambda max1$; and a wavelength at which $B(\lambda) \times V(\lambda)$ becomes largest is $\lambda max2$.

It is more preferable that the above-mentioned white light source satisfy a relational equation of $-0.1 \leq [(P(\lambda) \times V(\lambda))/(P(\lambda max1) \times V(\lambda max1)) - (B(\lambda) \times V(\lambda))/(B(\lambda max2) \times V(\lambda max2))] \leq +0.1$. Further, it is preferable that the color temperature of the white light source is set to be 2,500 to 7,000 K.

It is preferable that the above-mentioned white light source include an LED and a phosphor. Further, it is preferable that the LED has a light emission peak wavelength in a range of 350 to 420 nm and that the phosphor has at least one light emission peak wavelength in a range of 420 to 700 nm. Further, it is preferable that the above-mentioned white light source include three or more types (more preferably four or more types) of phosphor each having different peak wavelengths. Further, it is still more preferable that the above-mentioned white light source include five or more types of phosphor each having different peak wavelengths.

Further, it is preferable that the phosphors be mixed with a resin to form a phosphor layer. Further, it is preferable that the phosphor layer have a multi-layered structure in which a plurality of phosphor elements formed by dispersing phosphor particles in a resin are laminated. Further, a white light source system according to the present invention includes a plurality of the above-mentioned white light sources according to the present invention.

Advantages of the Invention

A white light source according to the present invention can reproduce the same light emission spectrum as that of natural light. Accordingly, even if a human body is exposed to white light emitted from the white light source for a long time, adverse effects on the human body can be made equivalent to those of natural light.

BRIEF DESCRIPTION OF THE DRAWINGS

FIG. 1 is a graph showing a spectral luminous efficiency $V(\lambda)$.

FIG. 2 is a mathematical expression (formula) for obtaining a light emission spectrum $B(\lambda)$ of black-body radiation.

FIG. 3 is a graph showing an example of the light emission spectrum of natural light in the daytime.

BEST MODE FOR CARRYING OUT THE INVENTION

A white light source according to an embodiment of the present invention satisfies a relational equation of $-0.2 \leq [(P(\lambda) \times V(\lambda))/(P(\lambda max1) \times V(\lambda max1)) \times (B(\lambda) \times V(\lambda))/(B(\lambda max2) \times V(\lambda max2))] \leq +0.2$, assuming that: the light emission spectrum of the white light source is $P(\lambda)$; the light emission spectrum of black-body radiation having the same color temperature as that of the white light source is $B(\lambda)$; the spectrum of a spectral luminous efficiency is $V(\lambda)$; the wavelength at which $P(\lambda) \times V(\lambda)$ becomes largest is $\lambda max1$; and the wavelength at which $B(\lambda) \times V(\lambda)$ becomes largest is $\lambda max2$. Here, $\lambda$ denotes a wavelength of 380 to 780 nm in a visible light region.

The white light source satisfying the above-mentioned relational equation is configured according to the following procedures. First, the light emission spectrum $P(\lambda)$ of the white light source is measured. The light emission spectrum is measured according to total luminous flux measurement using an integrating sphere in conformity with JIS-C-8152. The color temperature is calculated from the light emission spectrum. Note that the unit of the color temperature is kelvin (K).

Next, the light emission spectrum $B(\lambda)$ of the black-body radiation having the same color temperature as that of the white light source is obtained. The light emission spectrum $B(\lambda)$ is obtained according to Planck's distribution. The Planck's distribution can be obtained according to a mathematical expression shown in FIG. 2. In FIG. 2, h denotes a Planck's constant, c denotes the speed of light, $\lambda$ denotes a wavelength, e denotes a base of natural logarithm, k denotes a Boltzmann's constant, and T denotes a color temperature. Because h, c, e, and k are constants, if the color temperature T is determined, the light emission spectrum of the black-body radiation can be obtained in accordance with the wavelength $\lambda$.

Figure 4:
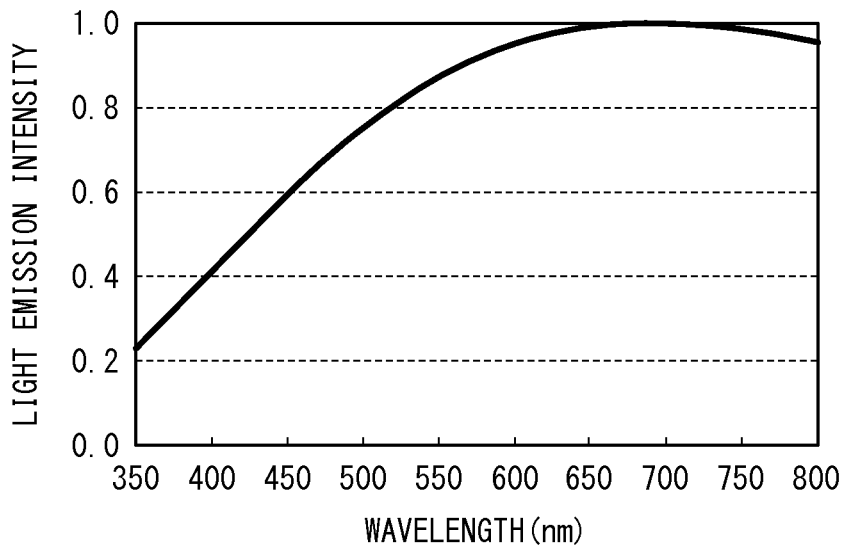
FIG. 4 is a graph showing an example of the light emission spectrum of natural light in the morning.
Figure 5:
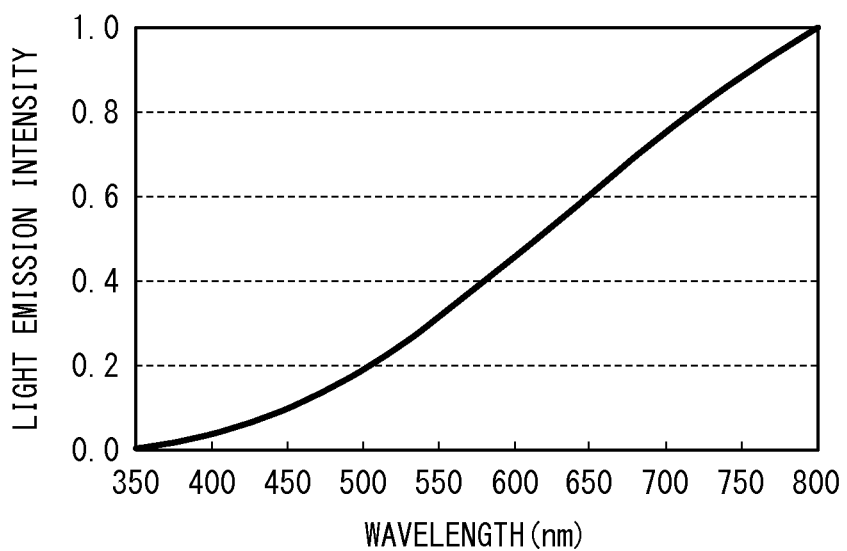
FIG. 5 is a graph showing an example of the light emission spectrum of natural light at sunrise.

In the present invention, the black-body radiation indicates the light emission spectrum of natural light (sunlight). The natural light has different color temperatures, for example, in the daytime, in the morning, and at sunrise. FIG. 3 shows an example of the light emission spectrum of the natural light in the daytime (a color temperature of 5,100 K), FIG. 4 shows an example of the light emission spectrum of the natural light in the morning (a color temperature of 4,200 K), and FIG. 5 shows an example of the light emission spectrum of the natural light at sunrise (a color temperature of 2,700 K). Note that 7 a.m. is assumed as the morning in FIG. 4.

Figure 6:
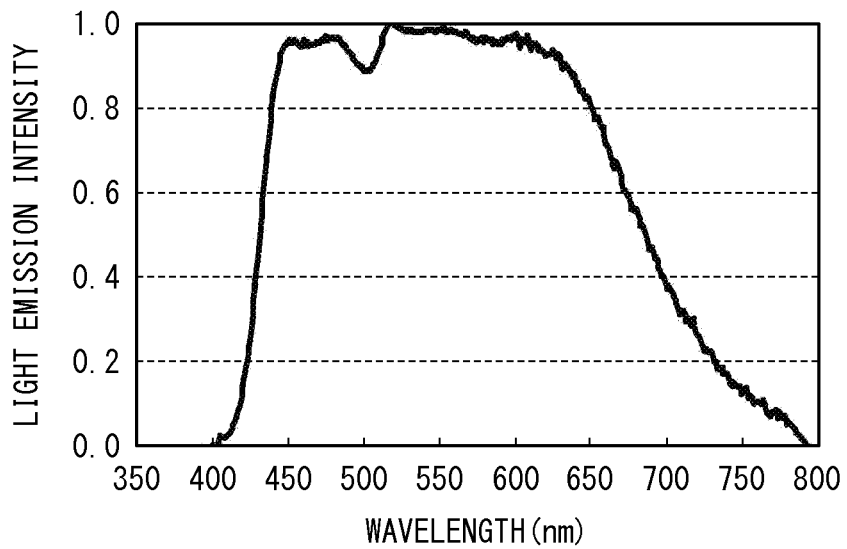
FIG. 6 is a graph showing a light emission spectrum in Example 1.
Figure 7:
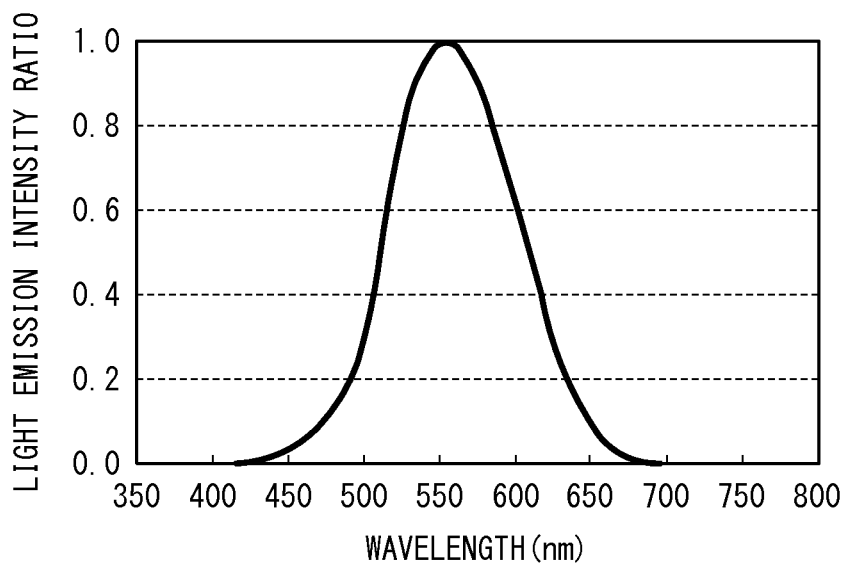
FIG. 7 is a graph showing $(P(\lambda) \times V(\lambda))/(P(\lambda max1) \times V(\lambda max1))$ in Example 1.
Figure 8:
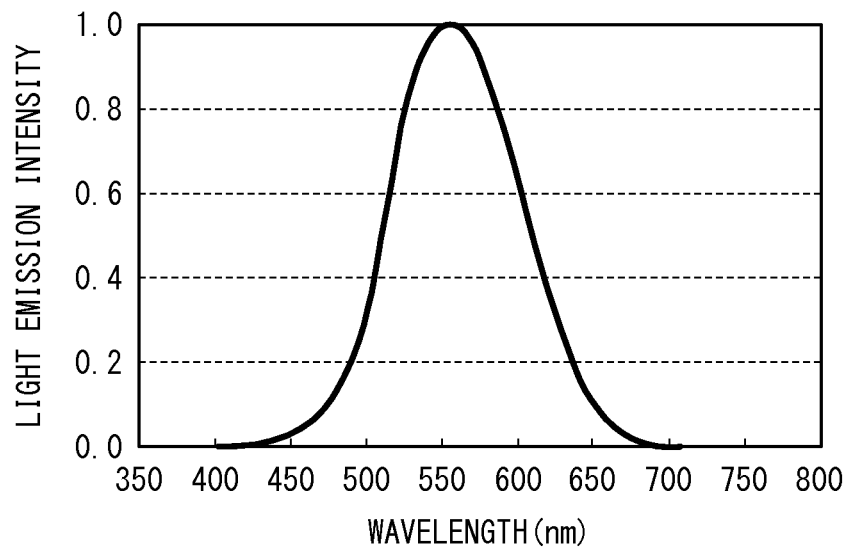
FIG. 8 is a graph showing $(B(\lambda) \times V(\lambda))/(B(\lambda max2) \times V(\lambda max2))$ assuming that black-body radiation having the same color temperature as that in FIG. 3 is $B(\lambda)$.

FIG. 6 shows a light emission spectrum $P(\lambda)$ in Example 1 to be described later. FIG. 7 shows $(P(\lambda) \times V(\lambda))/(P(\lambda max1) \times V(\lambda max1))$ in Example 1. FIG. 8 shows $(B(\lambda) \times V(\lambda))/(B(\lambda max2) \times V(\lambda max2))$ assuming that the light emission spectrum of the natural light in the daytime (FIG. 3) is $B(\lambda)$.

The spectral luminous efficiency shown in FIG. 1 is used for $V(\lambda)$ for obtaining FIG. 7 and FIG. 8.

FIG. 7 is a graph obtained by: multiplying, for each wavelength, values of the light emission spectrum $P(\lambda)$ in Example 1 shown in FIG. 6 by values of the spectral luminous efficiency $V(\lambda)$; dividing the resultant products by $(P(\lambda max1) \times V(\lambda max1))$; and plotting the resultant quotients. In FIG. 7, the wavelength at which $(P(\lambda) \times V(\lambda))$ becomes largest is $\lambda max1=556$ nm.

FIG. 8 is a graph obtained by: multiplying, for each wavelength, values of the light emission spectrum $B(\lambda)$ in FIG. 3 by values of the spectral luminous efficiency $V(\lambda)$; dividing the resultant products by $(B(\lambda max2) \times V(\lambda max2))$; and plotting the resultant quotients. In FIG. 8, the wavelength at which $(B(\lambda) \times V(\lambda))$ becomes largest is $\lambda max2=556$ nm.

$(P(\lambda) \times V(\lambda))$ indicates the intensity of the light emission spectrum of the white light source in a spectral luminous efficiency $V(\lambda)$ region. $(P(\lambda) \times V(\lambda))$ is divided by $(P(\lambda max1) \times V(\lambda max1))$ that is the maximum value, whereby the upper limit thereof can be 1.0 as shown in FIG. 7.

Further, $(B(\lambda) \times V(\lambda))$ indicates the intensity of the light emission spectrum of the black-body radiation in the spectral luminous efficiency $V(\lambda)$ region. $(B(\lambda) \times V(\lambda))$ is divided by $(B(\lambda max2) \times V(\lambda max2))$ that is the maximum value, whereby the upper limit thereof can be 1.0 as shown in FIG. 8.

Next, a difference $A(\lambda)=[(P(\lambda) \times V(\lambda))/(P(\lambda max1) \times V(\lambda max1))-(B(\lambda) \times V(\lambda))/(B(\lambda max2) \times V(\lambda max2))]$ is obtained. The white light source according to the present embodiment satisfies a relation: $-0.2 \leq [(P(\lambda) \times V(\lambda))/(P(\lambda max1) \times V(\lambda max1))-(B(\lambda) \times V(\lambda))/(B(\lambda max2) \times V(\lambda max2))] \leq +0.2$. If the difference $A(\lambda)$ satisfies the relation: $-0.2 \leq A(\lambda) \leq +0.2$, the light emission spectrum of the white light source in the spectral luminous efficiency $V(\lambda)$ region is close to the light emission spectrum of the black-body radiation, in other words, the light emission spectrum of the natural light. That is, if the difference $A(\lambda)$ is zero ($A(\lambda)=0$), the same light emission spectrum as that of the natural light can be reproduced.

Figure 9:
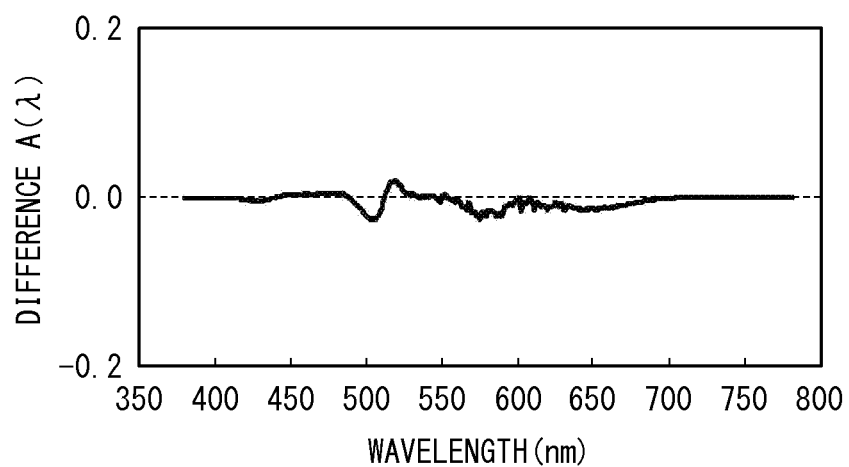
FIG. 9 is a graph showing a difference $A(\lambda)$ in Example 1.

FIG. 9 shows the difference $A(\lambda)$ in Example 1. As is apparent from FIG. 9, in Example 1, the range of the difference $A(\lambda)$ is $-0.03 \leq A(\lambda) \leq +0.02$, and it can be confirmed that the natural light in the daytime is reproduced in Example 1.

As described above, according to the present embodiment, the light emission spectrum is designed to be close to the light emission spectrum of the black-body radiation. Hence, as compared with conventional white LEDs having blue light peaks that stand out to be outstanding, the present embodiment can considerably suppress the adverse effects on a human circadian rhythm.

As described later in examples, the natural light at sunrise and the natural light in the morning can be also reproduced, and hence the light emission spectrum may be controlled so as to suit an intended use.

Further, if white light sources that can reproduce the natural light in the daytime, the natural light at sunrise, and the natural light in the morning are combined, the same natural light as one-day sunlight can be reproduced. For example, if such combined white light sources are used as lighting equipment in a hospital ward and in a place or room used for long-time indoor work, adverse effects on the circadian rhythms of patients who live therein and staffs who work therein can be suppressed. Further, because the natural light can be reproduced, application to agricultural fields such as plant cultivation using the natural light is also possible.

It is preferable that such a white light source have a light emission color temperature of 2,500 to 7,000 K. If this color temperature falls below 2,500 K and exceeds 7,000 K, a color temperature that does not exist in the natural light may be unfavorably produced. The preferable range of the color temperature is 2,700 to 6,700 K.

It is preferable that the white light source having the difference $A(\lambda)$ as described above include a light emitting diode (LED) and a phosphor. It is preferable that the light emission peak wavelength of the LED is set to be in a range of 350 to 420 nm. It is preferable to adopt a method of converting LED light having a light emission peak in an ultraviolet to violet region, into visible light by means of the phosphor. The light emission peak heights of a blue LED, a green LED, and a red LED each having a light emission peak wavelength of 420 nm or more are large, and hence it is difficult to control the difference $A(\lambda)$ thereof to fall within a range of $-0.2 \leq A(\lambda) \leq +0.2$. Further, not limited to LEDs, a semiconductor laser and the like may be used as long as the used light emission source has a light emission peak wavelength of 350 to 420 nm.

It is preferable that, when the phosphor is excited by a light emission source of 350 to 420 nm, the light emission peak wavelength of the phosphor be in a range of 420 to 700 nm. Further, it is preferable to use three or more types (more preferably five or more types) of phosphor having different peak wavelengths. Further, adjacent peak wavelengths of the phosphors are different (are deviated to each other) by preferably 150 nm or less, more preferably 10 to 100 nm, and still more preferably 10 to 50 nm. That is, from a blue region to a red region, the peak wavelengths different every 10 to 100 nm are combined with the use of three or more types (more preferably five or more types) of phosphor, whereby $-0.2 \leq$ the difference $A(\lambda) \leq +0.2$ can be achieved.

The material for constituting each phosphor is not particularly limited as long as the light emission peak thereof is in a range of 420 to 700 nm, and the following phosphors are preferable as phosphors excited at 350 to 420 nm. Further, the half-value width (half band width) of the peak wavelength of the light emission spectrum of each phosphor is as wide as preferably 40 nm or more and more preferably 50 to 100 nm.

Examples of the blue phosphor (B) may include a europium-activated alkaline-earth phosphate phosphor (a peak wavelength of 440 to 455 nm) and a europium-activated barium magnesium aluminate phosphor (a peak wavelength of 450 to 460 nm) or the like. Further, examples of the blue-green phosphor may include a europium-activated strontium aluminate phosphor (a peak wavelength of 480 to 500 nm) and a europium- and manganese-activated barium magnesium aluminate phosphor (a peak wavelength of 510 to 520 nm) or the like.

Examples of the green phosphor (G) may include a europium-activated orthosilicate phosphor (a peak wavelength of 520 to 550 nm), a europium-activated β-sialon phosphor (a peak wavelength of 535 to 545 nm), and a europium-activated strontium sialon phosphor (a peak wavelength of 510 to 530 nm) or the like.

Examples of the yellow phosphor (Y) may include a europium-activated orthosilicate phosphor (a peak wavelength of 550 to 580 nm) and a cerium-activated rare-earth aluminum garnet phosphor (a peak wavelength of 550 to 580 nm) or the like.

Examples of the red phosphor (R) may include a europium-activated strontium sialon phosphor (a peak wavelength of 600 to 630 nm), a europium-activated calcium strontium oxynitride phosphor (a peak wavelength of 610 to 650 nm), a europium-activated lanthanum oxysulfide phosphor (a peak wavelength of 620 to 630 nm), and a manganese-activated magnesium fluorogermanate (a peak wavelength of 640 to 660 nm) or the like.

In order to control the difference A(λ), it is preferable to use three or more types (more preferably five or more types) of phosphor from among the above-mentioned examples of the blue phosphor, the blue-green phosphor, the green phosphor, the yellow phosphor, and the red phosphor. Further, the color temperature can be controlled by changing the mixing proportion of the phosphors.

It is preferable that the average particle size of each phosphor is set to be 5 to 40 μm. If the average particle size is less than 5 μm, the particle size is excessively small, and manufacture of the phosphors is thus difficult, leading to an increase in costs. On the other hand, if the average particle size is larger than 40 μm, it is difficult to uniformly mix the phosphors.

Figure 10:
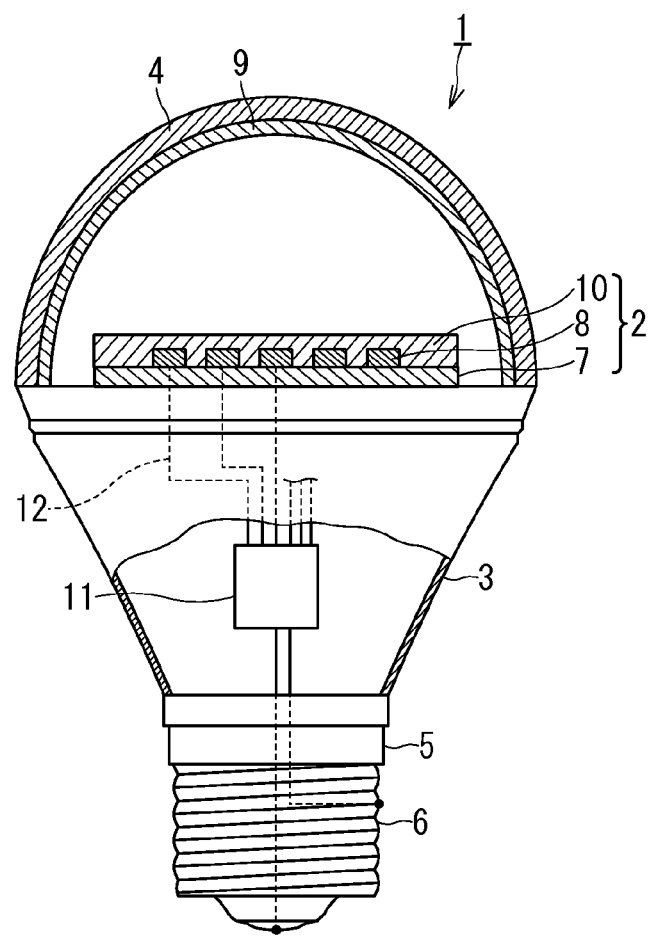
FIG. 10 is a cross sectional view illustrating an embodiment of a bulb-type white light source according to the present invention.

Next, a structure of the white light source will be explained. FIG. 10 illustrates a bulb-type white light source as an embodiment of the white light source according to the present invention. In FIG. 10, a reference numeral of 1 denotes an LED bulb (white light source), 2 denotes an LED module, 3 denotes a base body, 4 denotes a globe, 5 denotes an insulating member, 6 denotes a cap, 7 denotes a substrate, 8 denotes LED chips, 9 denotes a phosphor layer, and 10 denotes a transparent resin layer.

That is, the LED bulb 1 illustrated in FIG. 10 includes: the LED module 2; the base body 3 to which the LED module 2 is arranged; the globe 4 that is attached to an upper portion of the base body 3 so as to cover the LED module 2; the cap 6 that is attached to a lower end part of the base body 3 with the intermediation of the insulating member 5; and a lighting circuit 11 provided inside of the base body 3.

The LED module 2 includes the LED chips 8 that emit ultraviolet to violet light and are mounted on the substrate 7. The plurality of LED chips 8 are surface-mounted on the substrate 7. For example, InGaN-based, GaN-based, and AlGaN-based light emitting diodes or the like are used for the LED chips 8 that emit ultraviolet to violet light.

A wiring network (not illustrated) is provided on a surface of the substrate 7 (further provided inside thereof as needed), and an electrode of each LED chip 8 is electrically connected to the wiring network of the substrate 7. Wiring lines 12 are drawn out from a side surface or a bottom surface of the LED module 2, and the wiring lines 12 are electrically connected to the lighting circuit 11 provided inside of the base body 3. The LED chips 8 are turned on by DC voltage applied via the lighting circuit 11.

The phosphor layer 9 that absorbs ultraviolet to violet light emitted from the LED chips 8 and emits white light is provided on an inner surface of the globe 4. The phosphor layer 9 is formed by combining three or more types (more preferably five or more types) of phosphor having different peak wavelengths. Further, the phosphors may be mixed with a resin to form the phosphor layer 9, as needed. Further, all the phosphors may be mixed to form a mixed phosphor layer. Alternatively, phosphor layers formed by mixing about one to three types of phosphor are laminated to form a multi-layer phosphor layer.

Although FIG. 10 illustrates a structure in which the phosphor layer is provided on the inner surface of the globe 4, the phosphor layer may be provided on an outer surface of the globe 4, the phosphors may be mixed in the globe 4 itself, and the phosphors may be mixed in the transparent resin layer 10. Although FIG. 10 illustrates the bulb-type white light source, the present invention is not limited thereto, and can also be applied to a one-chip white light source. Further, not limited to the above-mentioned bulb types, the white light source according to the present invention can also be applied to a fluorescent light type (elongated type), a chandelier type, and the like, and the shape thereof is not limited.

As described above, the difference A(λ) is controlled to satisfy −0.2≤A(λ)≤+0.2, whereby a white light source that reproduces natural light can be provided. Further, white light sources that reproduce the natural light in the daytime, the natural light at sunrise, the natural light in the morning, the natural light in the evening, and the like are combined, whereby a white light source system that reproduces a rhythm of one-day natural light can be configured. As a result, it is possible to provide a white light source and a white light source system that suppress adverse effects on a human body circadian rhythm.

EXAMPLES

Example 1

LED chips each having a light emission peak wavelength of 400 nm were prepared. Next, prepared was a mixture including: a europium-activated alkaline-earth phosphate blue phosphor having a peak wavelength of 445 nm; a europium-activated strontium aluminate blue-green phosphor having a peak wavelength of 490 nm; a europium-activated orthosilicate green phosphor having a peak wavelength of 530 nm; a europium-activated orthosilicate yellow phosphor having a peak wavelength of 555 nm; and a europium-activated strontium sialon red phosphor having a peak wavelength of 630 nm, as phosphors that emitted light while being irradiated with electromagnetic waves of 400 nm.

The average particle size of the phosphors was set to 15 μm. The phosphors were mixed at a ratio by weight (ratio by mass) of blue phosphor:blue-green phosphor: green phosphor:yellow phosphor:red phosphor=30:15:20:15:20, was mixed with a transparent resin, and was applied to the globe inner surface, whereby the bulb-type white light source illustrated in FIG. 10 was manufactured. The correlated color temperature of light emission color of the obtained white light source was 5,100 K. This color temperature of 5,100 K is equivalent to the color temperature of the natural light in the daytime.

FIG. 6 shows a result obtained by measuring the light emission spectrum of the bulb-type white light source in Example 1 according to total luminous flux measurement using an integrating sphere in conformity with JIS-C-8152. FIG. 7 shows (P(λ)×V(λ))/(P(λmax1)×V(λmax1)) in Example 1, which is obtained by using the spectral luminous distribution V(λ) in FIG. 1. Note that λmax1 in Example 1 is 556 nm.

Then, FIG. 3 shows the light emission spectrum of blackbody radiation having a color temperature of 5,100 K, which is obtained according to Planck's distribution (the expression in FIG. 2). FIG. 8 shows (B(λ)×V(λ))/(B(λmax2)×V(λmax2)), which is obtained by assuming that the light emission spectrum in FIG. 3 is B(λ). Note that λmax2 is 556 nm.

The difference A(λ) in Example 1 was obtained according to [(P(λ)×V(λ))/(P(λmax1)×V(λmax1))−(B(λ)×V(λ))/(B(λmax2)×V(λmax2))]. FIG. 9 shows the result thereof. As is apparent from FIG. 9, in the white light source in Example 1, the difference A(λ) from the light emission spectrum of the natural light in the daytime was in a range of −0.2 to +0.2 in a visible light region of 380 to 780 nm. Specifically, the difference A(λ) was −0.03 to +0.02.

Example 2

LED chips each having a light emission peak wavelength of 400 nm were prepared. Next, prepared was a mixture including: a europium-activated alkaline-earth phosphate blue phosphor having a peak wavelength of 445 nm; a europium-activated strontium aluminate blue-green phosphor having a peak wavelength of 490 nm; a europium-activated orthosilicate green phosphor having a peak wavelength of 530 nm; a europium-activated orthosilicate yellow phosphor having a peak wavelength of 555 nm; and a europium-activated strontium sialon red phosphor having a peak wavelength of 630 nm, as phosphors that emitted light while being irradiated with electromagnetic waves of 400 nm. The average particle size of the phosphors was set to 15 µm. The phosphors were mixed at a ratio by weight (ratio by mass) of blue phosphor:blue-green phosphor:green phosphor:yellow phosphor:red phosphor=10:15:25:20:30, was mixed with a transparent resin, and was applied to the globe inner surface, whereby the bulb-type white light source illustrated in FIG. 10 was manufactured. The correlated color temperature of light emission color of the obtained white light source was 4,200 K. This color temperature of 4,200 K is equivalent to the color temperature of the natural light in the morning.

Figure 11:
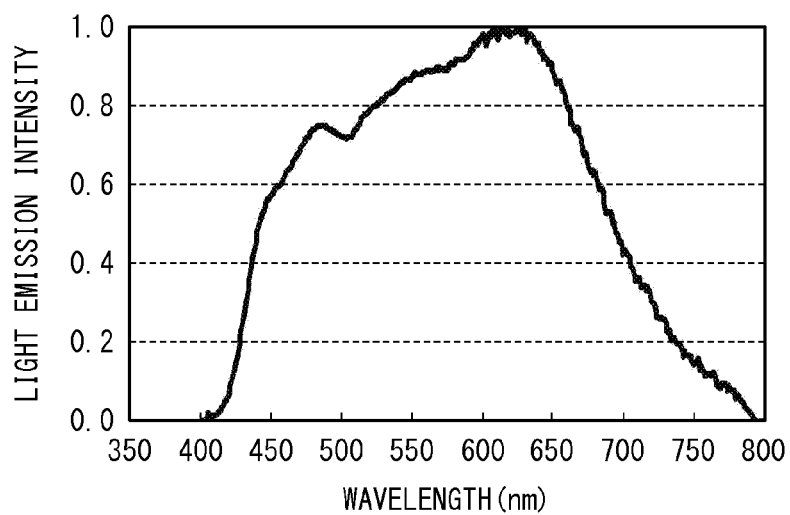
FIG. 11 is a graph showing the light emission spectrum of a white light source in Example 2.
Figure 12:
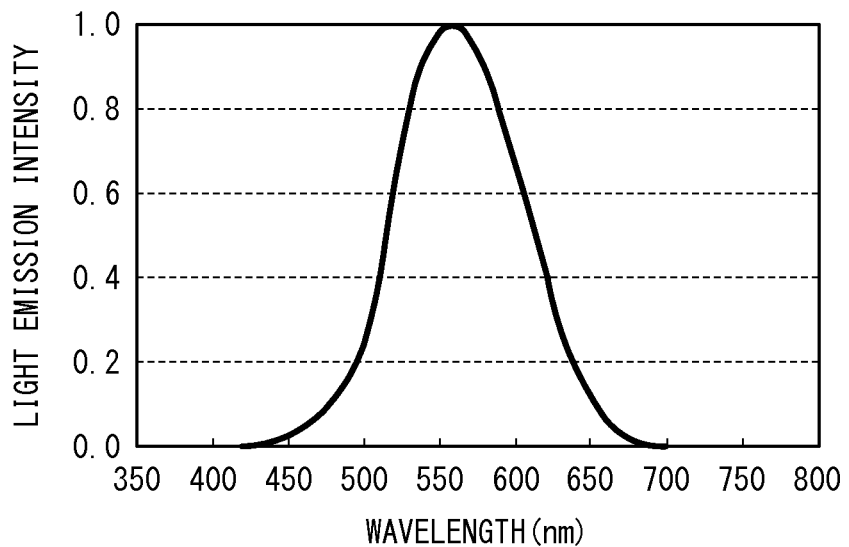
FIG. 12 is a graph showing $(P(\lambda) \times V(\lambda))/(P(\lambda max1) \times V(\lambda max1))$ in Example 2.

Similarly to Example 1, the light emission spectrum of the white light source in Example 2 was checked according to total luminous flux measurement using an integrating sphere. FIG. 11 shows the result thereof. FIG. 12 shows $(P(\lambda) \times V(\lambda))/(P(\lambda max1) \times V(\lambda max1))$ in Example 2, which is obtained by using the spectral luminous efficiency $V(\lambda)$ shown in FIG. 1. Note that $\lambda max1$ in Example 2 is 560 nm.

Figure 13:
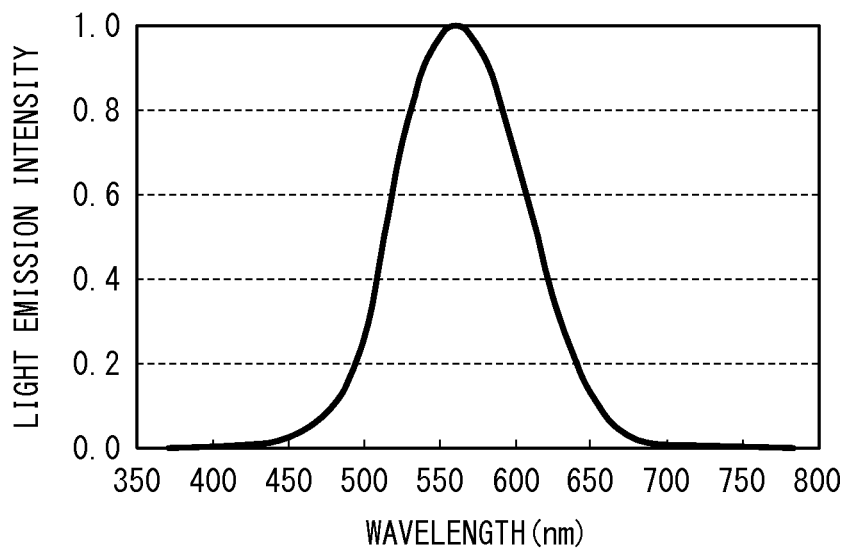
FIG. 13 is a graph showing $(B(\lambda) \times V(\lambda))/(B(\lambda max2) \times V(\lambda max2))$ assuming that black-body radiation having the same color temperature as that in FIG. 4 is $B(\lambda)$.

Then, FIG. 4 shows the light emission spectrum of black-body radiation having a color temperature of 4,200 K, which is obtained according to Planck's distribution (the expression in FIG. 2). FIG. 13 shows $(B(\lambda) \times V(\lambda))/(B(\lambda max2) \times V(\lambda max2))$, which is obtained by assuming that the light emission spectrum in FIG. 4 is $B(\lambda)$. Note that $\lambda max2$ is 560 nm.

Figure 14:
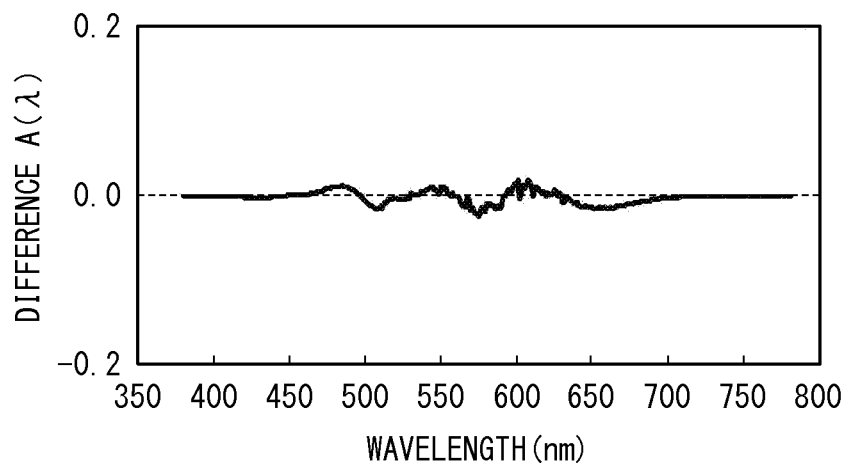
FIG. 14 is a graph showing a difference $A(\lambda)$ in Example 2.

The difference $A(\lambda)$ in Example 2 was obtained according to $[(P(\lambda) \times V(\lambda))/(P(\lambda max1) \times V(\lambda max1))-(B(\lambda) \times V(\lambda))/(B(\lambda max2) \times V(\lambda max2))]$. FIG. 14 shows the result thereof. As is apparent from FIG. 14, in the white light source in Example 2, the difference $A(\lambda)$ from the light emission spectrum of the natural light in the morning is in a range of −0.2 to +0.2 in a visible light region of 380 to 780 nm. Specifically, the difference $A(\lambda)$ is −0.04 to +0.03.

Example 3

LED chips each having a light emission peak wavelength of 400 nm were prepared. Prepared was a mixture including: a europium-activated alkaline-earth phosphate blue phosphor having a peak wavelength of 445 nm; a europium-activated strontium aluminate blue-green phosphor having a peak wavelength of 490 nm; a europium-activated orthosilicate green phosphor having a peak wavelength of 530 nm; a europium-activated orthosilicate yellow phosphor having a peak wavelength of 555 nm; and a europium-activated strontium sialon red phosphor having a peak wavelength of 630 nm, as phosphors that emitted light while being irradiated with electromagnetic waves of 400 nm.

The average particle size of the phosphors was set to 15 µm. The phosphors were mixed at a ratio by weight of blue phosphor:blue-green phosphor:green phosphor:yellow phosphor:red phosphor=5:10:20:25:40, was mixed with a transparent resin, and was applied to the globe inner surface, whereby the bulb-type white light source illustrated in FIG. 10 was manufactured. The correlated color temperature of light emission color of the obtained white light source was 2,700 K. This color temperature of the white light source is equivalent to the color temperature of the natural light at sunrise.

Figure 15:
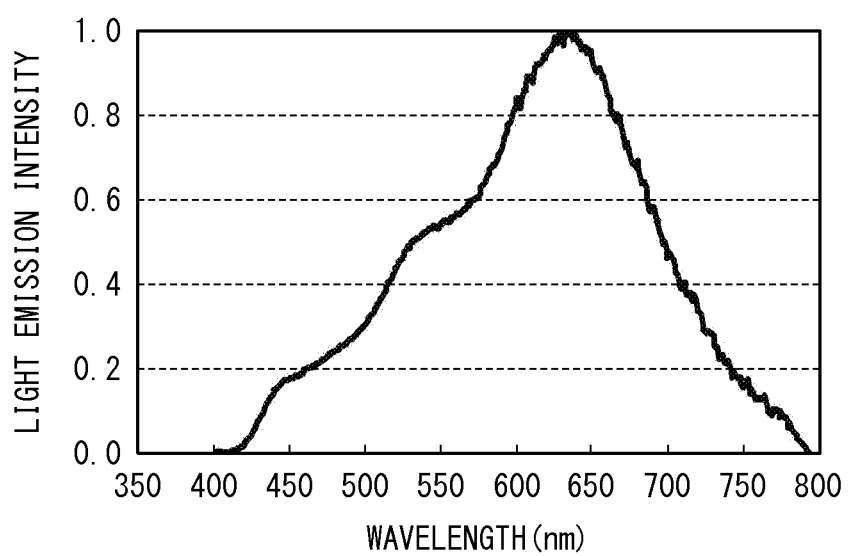
FIG. 15 is a graph showing a light emission spectrum in Example 3.
Figure 16:
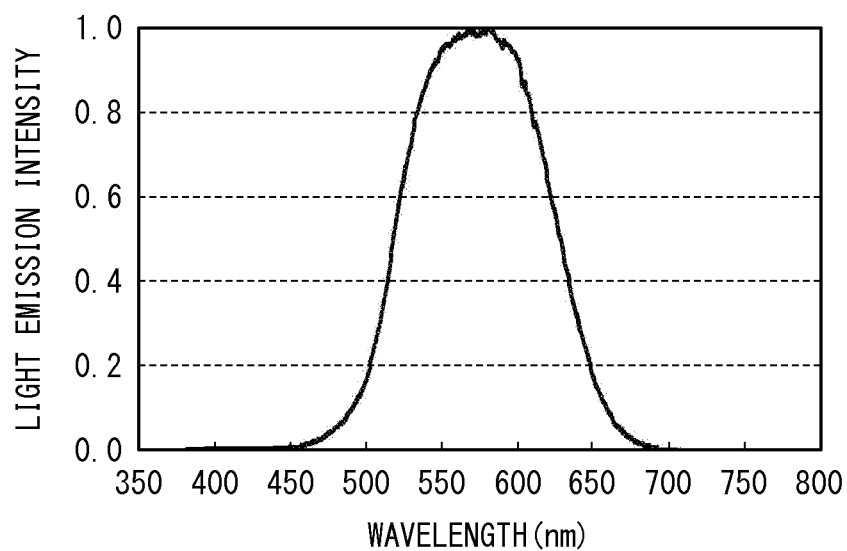
FIG. 16 is a graph showing $(P(\lambda) \times V(\lambda))/(P(\lambda max1) \times V(\lambda max1))$ in Example 3.

Similarly to Example 1, the light emission spectrum of the white light source in Example 3 was checked according to total luminous flux measurement using an integrating sphere. FIG. 15 shows the result thereof. FIG. 16 shows $(P(\lambda) \times V(\lambda))/(P(\lambda max1) \times V(\lambda max1))$ in Example 3, which is obtained using the spectral luminous efficiency $V(\lambda)$ shown in FIG. 1. Note that $\lambda max1$ in Example 3 is 570 nm.

Figure 17:
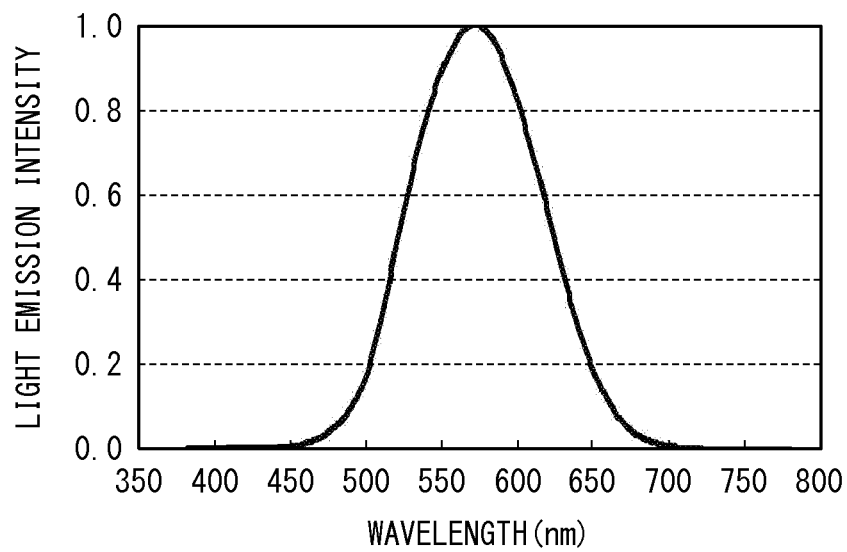
FIG. 17 is a graph showing $(B(\lambda) \times V(\lambda))/(B(\lambda max2) \times V(\lambda max2))$ assuming that black-body radiation having the same color temperature as that in FIG. 5 is $B(\lambda)$.

Then, FIG. 5 shows the light emission spectrum of black-body radiation having a color temperature of 2,700 K, which is obtained according to Planck's distribution (the expression in FIG. 2). FIG. 17 shows $(B(\lambda) \times V(\lambda))/(B(\lambda max2) \times V(\lambda max2))$, which is obtained by assuming that the light emission spectrum in FIG. 5 is $B(\lambda)$. Note that $\lambda max2$ is 570 nm.

Figure 18:
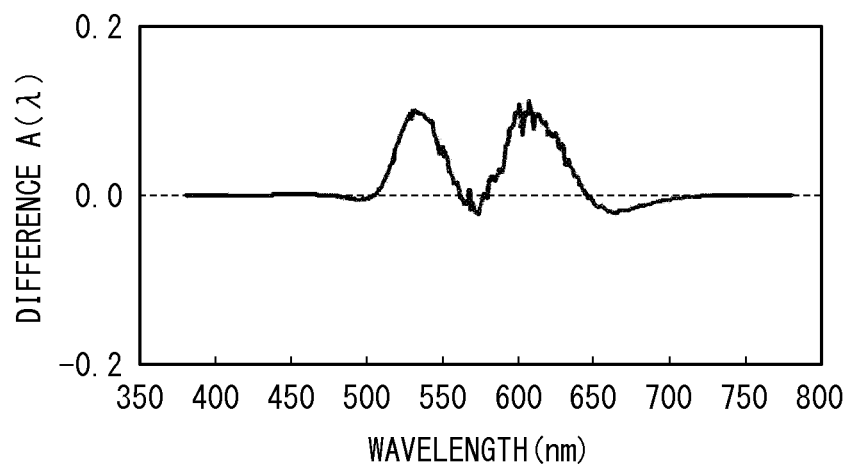
FIG. 18 is a graph showing a difference $A(\lambda)$ in Example 3.

The difference $A(\lambda)$ in Example 3 was obtained according to $[(P(\lambda) \times V(\lambda))/(P(\lambda max1) \times V(\lambda max1))-(B(\lambda) \times V(\lambda))/(B(\lambda max2) \times V(\lambda max2))]$. FIG. 18 shows the result thereof. As is apparent from FIG. 18, in the white light source in Example 3, the difference $A(\lambda)$ from the light emission spectrum of the natural light at sunrise is in a range of −0.2 to +0.2 in a visible light region of 380 to 780 nm. Specifically, the difference $A(\lambda)$ is −0.03 to +0.15.

Example 4

LED chips each having a light emission peak wavelength of 410 nm were prepared. Next, prepared was a mixture including: a europium-activated barium magnesium aluminate blue phosphor having a peak wavelength of 450 nm; a europium- and manganese-activated barium magnesium aluminate blue-green phosphor having a peak wavelength of 515 nm; a europium-activated orthosilicate green phosphor having a peak wavelength of 530 nm; a europium-activated orthosilicate yellow phosphor having a peak wavelength of 555 nm; and a europium-activated calcium strontium oxynitride red phosphor having a peak wavelength of 630 nm, as phosphors that emitted light while being irradiated with electromagnetic waves of 410 nm.

The average particle size of the phosphors was set to 20 µm. The phosphors were mixed at a ratio by weight (ratio by mass) of blue phosphor:blue-green phosphor:green phosphor:yellow phosphor:red phosphor=30:20:15:20:15, was mixed with a transparent resin, and was applied to the globe inner surface, whereby the bulb-type white light source illustrated in FIG. 10 was manufactured. The correlated color temperature of light emission color of the obtained white light source was 5,100 K. This color temperature of 5,100 K is equivalent to the color temperature of the natural light in the daytime.

Similarly to Example 1, the light emission spectrum of the white light source in Example 4 was checked according to total luminous flux measurement using an integrating sphere. Further, $(P(\lambda) \times V(\lambda))/(P(\lambda max1) \times V(\lambda max1))$ was obtained by using the spectral luminous efficiency $V(\lambda)$ shown in FIG. 1. Note that $\lambda max1$ in Example 4 is 556 nm.

Then, the light emission spectrum of black-body radiation having a color temperature of 5,100 K was obtained according to Planck's distribution (the expression in FIG. 2). $(B(\lambda) \times V(\lambda))/(B(\lambda max2) \times V(\lambda max2))$ was obtained by assuming that the light emission spectrum of the black-body radiation is $B(\lambda)$. Note that $\lambda max2$ is 556 nm.

The difference $A(\lambda)$ in Example 4 was obtained according to $[(P(\lambda) \times V(\lambda))/(P(\lambda max1) \times V(\lambda max1))-(B(\lambda) \times V(\lambda))/(B(\lambda max2) \times V(\lambda max2))]$. In the white light source in Example 4, the difference $A(\lambda)$ from the light emission spectrum of the natural light in the daytime was in a range of −0.2 to +0.2 in a visible light region of 380 to 780 nm. Specifically, the difference $A(\lambda)$ was −0.18 to +0.19.

Example 5

LED chips each having a light emission peak wavelength of 400 nm were prepared. Prepared was a mixture including: a europium-activated alkaline-earth phosphate blue phosphor having a peak wavelength of 445 nm; a europium-activated orthosilicate green phosphor having a peak wavelength of 530 nm; and a europium-activated strontium sialon red phosphor having a peak wavelength of 625 nm, as phosphors that were caused to emit light by electromagnetic waves of 400 nm from these LED chips.

The phosphors were mixed at a ratio by weight of blue phosphor:green phosphor:red phosphor=30:40:30, was mixed with a transparent resin, and was applied to the globe inner surface, whereby the bulb-type white light source illustrated in FIG. 10 was manufactured. The correlated color temperature of light emission color of the obtained white light source was 5,000 K. This color temperature is equivalent to the color temperature of the natural light in the daytime.

Figure 21:
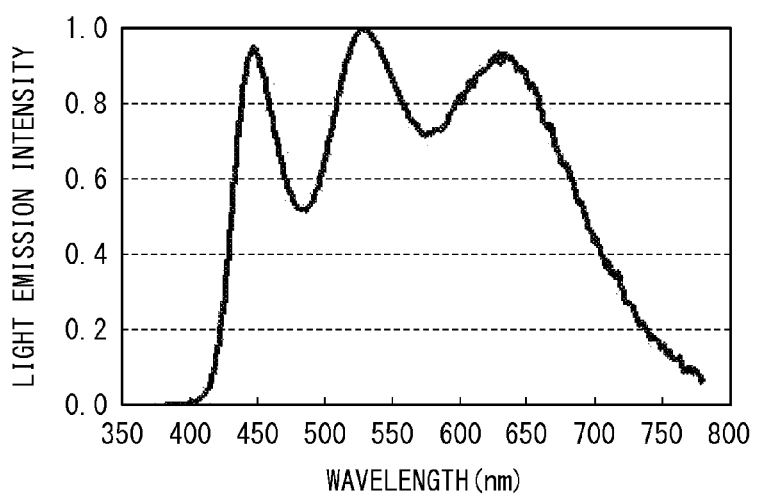
FIG. 21 is a graph showing a light emission spectrum $P(\lambda)$ of a white light source in Example 5.
Figure 23:
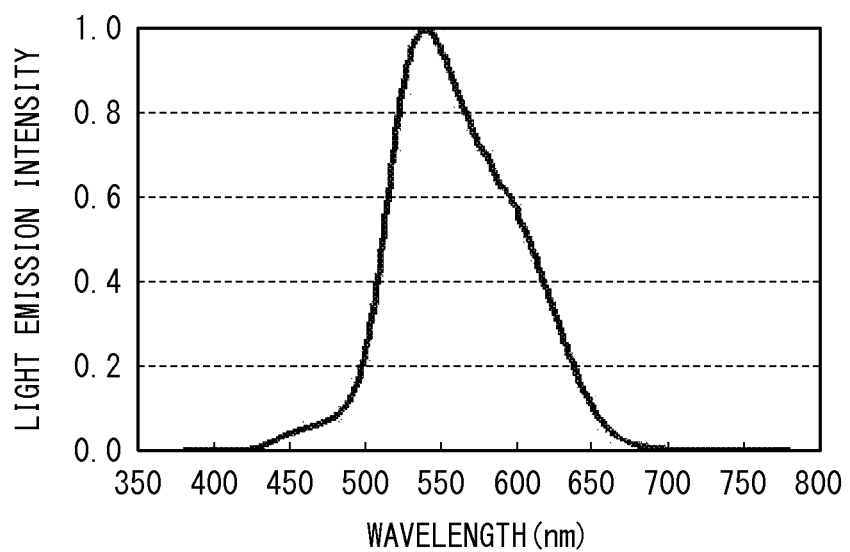
FIG. 23 is a graph showing $(P(\lambda) \times V(\lambda))/(P(\lambda max1) \times V(\lambda max1))$ of the white light source in Example 5.

Then, similarly to Example 1, the light emission spectrum $P(\lambda)$ of the white light source in Example 5 was checked according to total luminous flux measurement using an integrating sphere. FIG. 21 shows the result thereof. FIG. 23 shows $(P(\lambda) \times V(\lambda))/(P(\lambda max1) \times V(\lambda max1))$ in Example 5, which is obtained by using the standard luminosity function $V(\lambda)$ shown in FIG. 1. Note that $\lambda max1$ in this example is 540 nm.

Figure 22:
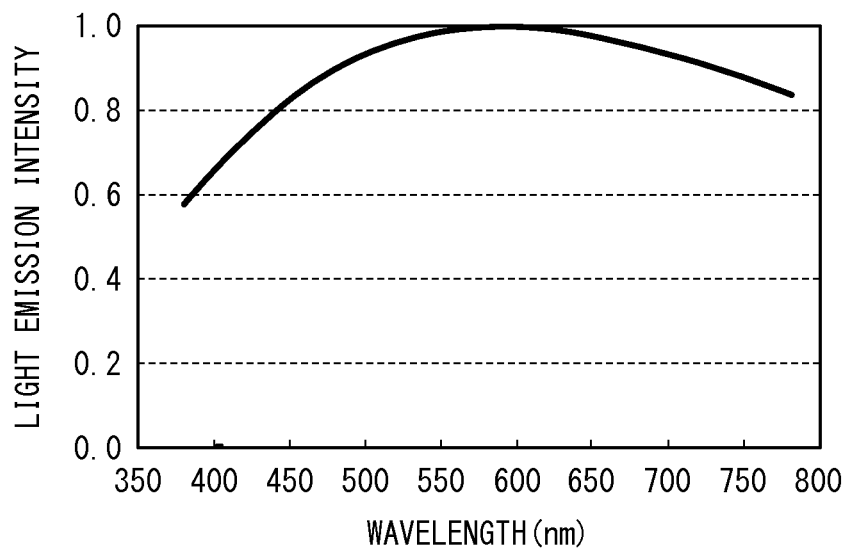
FIG. 22 is a graph showing black-body radiation $B(\lambda)$ having a color temperature of 5,000 K.
Figure 24:
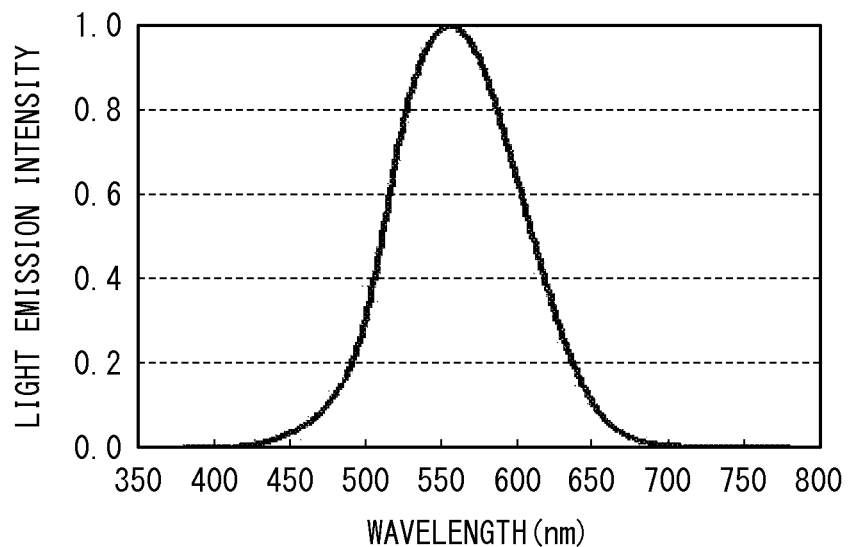
FIG. 24 is a graph showing $(B(\lambda) \times V(\lambda))/(B(\lambda max2) \times V(\lambda max2))$ of the white light source in Example 5.

Then, FIG. 22 shows the light emission spectrum of blackbody radiation having a color temperature of 5,000 K, which is obtained according to Planck's distribution (the expression in FIG. 2). FIG. 24 shows $(B(\lambda) \times V(\lambda))/(B(\lambda max2) \times V(\lambda max2))$, which is obtained by assuming that the light emission spectrum in FIG. 22 is $B(\lambda)$. Note that $\lambda max2$ is 555 nm.

Figure 25:
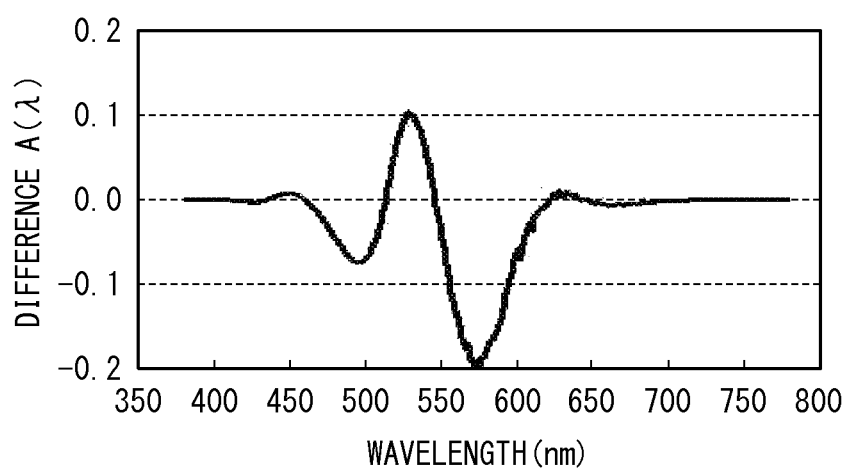
FIG. 25 is a graph showing a difference $A(\lambda)$ of the white light source in Example 5.

The difference $A(\lambda)$ in this example was obtained according to $[(P(\lambda) \times V(\lambda))/(P(\lambda max1) \times V(\lambda max1))-(B(\lambda) \times V(\lambda))/(B(\lambda max2) \times V(\lambda max2))]$. FIG. 25 shows the result thereof. As is apparent from FIG. 25, in the white light source in Example 5, the difference $A(\lambda)$ from the light emission spectrum of the natural light at sunrise was in a range of −0.2 to +0.2 in a visible light region of 380 to 780 nm. Specifically, the difference $A(\lambda)$ was −0.2 to +0.1.

Comparative Example 1

Figure 19:
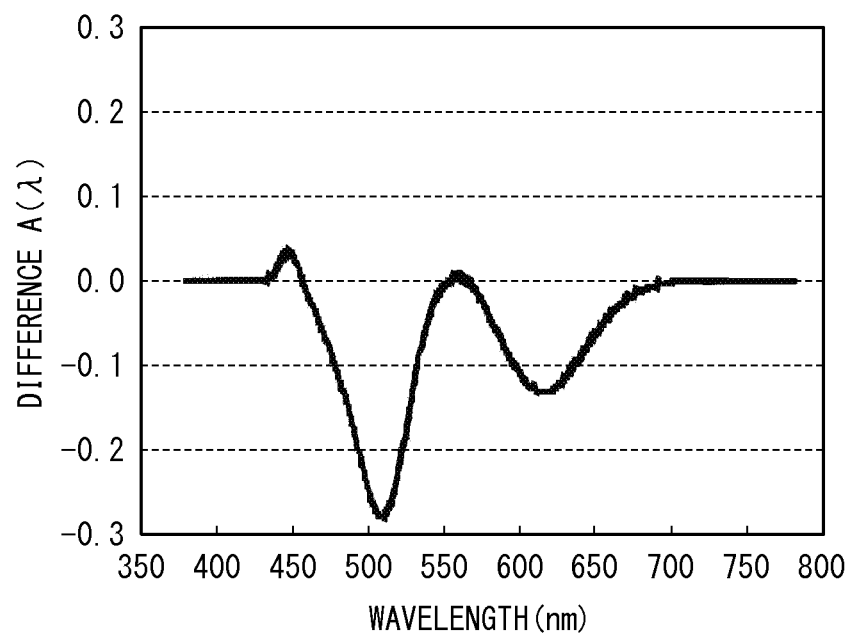
FIG. 19 is a graph showing a difference $A(\lambda)$ in Comparative Example 1.

A blue light emitting diode having a light emission peak wavelength of 460 nm was combined with a cerium-activated yttrium aluminum garnet yellow phosphor, whereby a white light source in Comparative Example 1 was manufactured. The color temperature of the white light source in Comparative Example 1 was 5,100 K, and the difference $A(\lambda)$ thereof was −0.28 to +0.04 as shown in FIG. 19.

Subjects (ten persons) spent from 9:00 to 17:00 in the daytime under the white light source in each of the above-mentioned examples and Comparative Example 1 at the same intensity of illumination, and the amount of secreted melatonin was measured at night (21:00) of the same day. Note that the amount of secreted melatonin was analyzed according to a saliva test. The amount of secreted melatonin (the average value of the ten persons) in each of the above-mentioned examples was measured assuming that the amount of secreted melatonin in Comparative Example 1 was 100. Table 1 shows the results thereof.

TABLE 1

| Sample No. | Amount of Secreted Melatonin |
|---|---|
| Example 1 | 120 |
| Example 2 | 125 |
| Example 3 | 130 |
| Example 4 | 118 |
| Example 5 | 118 |
| Comparative Example 1 | 100 |

As is apparent from the results shown in Table 1, the amount of melatonin secreted in the subjects was larger in the white light source in each of the above-mentioned examples than that in the conventional white light source in Comparative Example 1. Melatonin is one of hormones secreted from the pineal body in a brain, and it is generally said that the amount of secreted melatonin is smaller during the day and is larger during the night. This is considered to be because humans live under natural light in the daytime. Hence, melatonin is considered as a hormone necessary to have restful sleep. Further, melatonin is widely used as supplements for preventing oxidation in the body in the U.S. and other countries.

Accordingly, with the use of the white light sources in the above-mentioned examples under circumstances where exposure to natural light is difficult (such as a hospital ward and a long-time indoor activity), an effect equivalent to that obtained by exposure to natural light can be obtained, and an effect of suppressing a sleep disorder and a circadian rhythm disturbance can be expected.

In the above-mentioned examples, the natural light in the daytime (Example 1, Example 4, and Example 5), the natural light at sunrise (Example 2), and the natural light in the morning (Example 3) were separately made. Alternatively, a white light source system is configured by combining the plurality of types of light as appropriate, whereby light equivalent to one-day natural light can be also reproduced.

Figure 20:
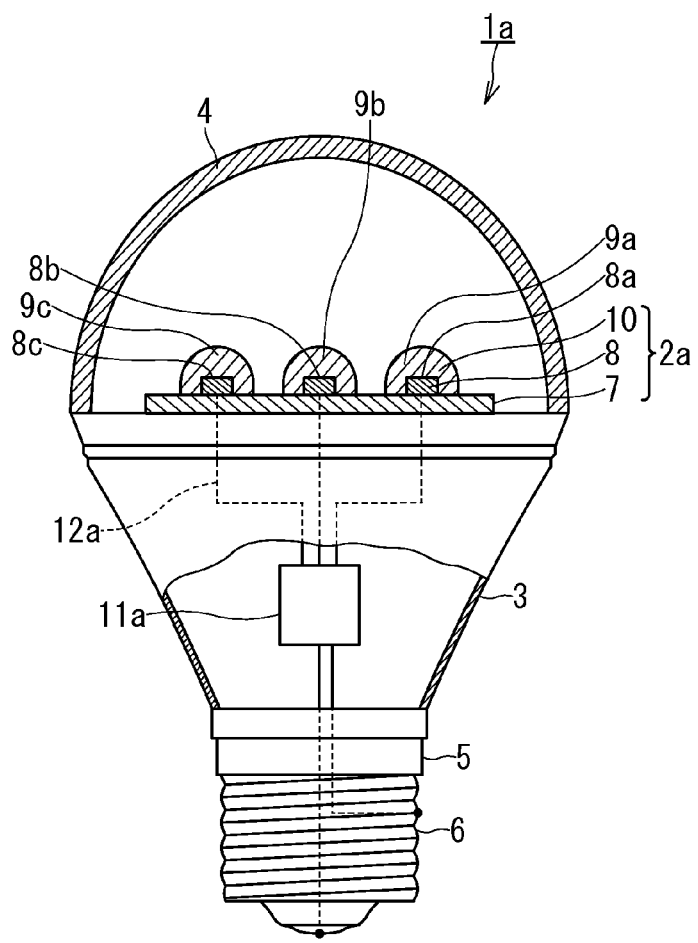
FIG. 20 is a cross sectional view illustrating another embodiment of the bulb-type white light source according to the present invention.

Specifically, as illustrated in FIG. 20, an LED chip 8a and a phosphor layer 9a for emitting the natural light in the daytime, an LED chip 8b and a phosphor layer 9b for emitting the natural light at sunrise, and an LED chip 8c and a phosphor layer 9c for emitting the natural light in the morning may be placed together on a common substrate 7. Then, the LED chips 8a, 8b, and 8c to which the phosphor layers 9a, 9b, and 9c are respectively joined may be housed in the same globe 4, whereby a white light source system 1a may be configured. Further, the transparent resin layer 10 may be provided between the LED chip 8 and the phosphor layer 9.

The LED chips 8a, 8b, and 8c are each connected to a lighting circuit 11a by a wiring line 12a. A user can select an LED chip to be turned on by means of a switching mechanism (not illustrated) attached to the lighting circuit 11a, as desired.

According to the white light source system 1a configured as described above, the natural light in the daytime, the natural light at sunrise, and the natural light in the morning can be selectively enjoyed from one white light source system 1a, in accordance with a user's desire and an illumination cycle. That is, white light sources that reproduce the natural light in the daytime, the natural light at sunrise, the natural light in the morning, the natural light in the evening, and the like are combined, whereby a white light source system that reproduces a rhythm of one-day natural light can be configured.

INDUSTRIAL APPLICABILITY

A white light source and a white light source system according to the present invention can reproduce the same light emission spectrum as that of natural light. Accordingly, even if a human body is exposed to white light emitted from the white light source for a long time, adverse effects on the human body can be made equivalent to those of natural light.

The invention claimed is:

1. A white light source satisfying a relational equation of $$-0.2 \leq [(P(\lambda) \times V(\lambda))/(P(\lambda max1) \times V(\lambda max1)) - (B(\lambda) \times V(\lambda))/(B(\lambda max2) \times V(\lambda max2))] \leq +0.2,$$

assuming that: a light emission spectrum of the white light source is $P(\lambda)$; a light emission spectrum of black-body radiation having a same color temperature as that of the white light source is $B(\lambda)$; a spectrum of a spectral luminous efficiency is $V(\lambda)$; a wavelength at which $P(\lambda) \times V(\lambda)$ becomes largest is $\lambda max1$; and a wavelength at which $B(\lambda) \times V(\lambda)$ becomes largest is $\lambda max2$.

2. The white light source according to claim 1, satisfying $-0.1 \leq [(P(\lambda) \times V(\lambda))/(P(\lambda max1) \times V(\lambda max1)) - (B(\lambda) \times V(\lambda))/(B(\lambda max2) \times V(\lambda max2))] \leq +0.1$.

3. The white light source according to claim 1, wherein the color temperature of the white light source is 2,500 to 7,000 K.

4. The white light source according to claim 1, comprising an LED and a phosphor.

5. The white light source according to claim 4, wherein the LED has a light emission peak in a range of 350 to 420 nm, and
the phosphor has at least one light emission peak in a range of 420 to 700 nm.

6. The white light source according to claim 4, comprising three or more types of phosphors having different peak wavelengths.

7. The white light source according to claim 4, comprising five or more types of phosphors having different peak wavelengths.

8. The white light source according to claim 4, wherein the phosphors are mixed with a resin to form a phosphor layer.

9. The white light source according to claim 4, wherein adjacent peak wavelengths of the phosphors are different by 150 nm or less.

10. The white light source according to claim 8, wherein the phosphor layer has a multi-layered structure.

11. The white light source according to claim 4, the phosphor comprises at least one phosphor selected from the group consisting of:
europium-activated alkaline earth phosphate phosphor having a peak wavelength of 440 to 455 nm;
europium-activated barium magnesium aluminate phosphor having a peak wavelength of 450 to 460 nm;
europium-activated strontium aluminate phosphor having a peak wavelength of 480 to 500 nm;
europium- and manganeses-activated barium magnesium aluminate phosphor having a peak wavelength of 510 to 520 nm;
europium-activated orthosilicate phosphor having a peak wavelength of 520 to 550 nm;
europium-activated β-sialon phosphor having a peak wavelength of 535 to 545 nm;
europium-activated strontium sialon phosphor having a peak wavelength of 510 to 530 nm;
europium-activated orthosilicate phosphor having a peak wavelength of 550 to 580 nm;
cerium-activated rare-earth aluminum garnet phosphor having a peak wavelength of 550 to 580 nm;
europium-activated strontium sialon phosphor having a peak wavelength of 600 to 630 nm;
europium-activated calcium strontium oxynitride phosphor having a peak wavelength of 610 to 650 nm;
europium-activated lanthanum oxysulfide phosphor having a peak wavelength of 620 to 630 nm; and
manganese-activated magnesium fluorogermanate having a peak wavelength of 640 to 660 nm.

12. The white light source according to claim 6, the phosphors have an average particle size of 5 to 40 μm.

13. A white light source system comprising a plurality of the white light sources according to claim 1.

* * * * *